(12) United States Patent
Kakimi et al.

(10) Patent No.: US 11,600,977 B2
(45) Date of Patent: Mar. 7, 2023

(54) RESIN STRUCTURE

(71) Applicant: YAZAKI CORPORATION, Tokyo (JP)

(72) Inventors: Takaaki Kakimi, Makinohara (JP); Masahiro Wada, Makinohara (JP); Takao Nogaki, Makinohara (JP); Kazuki Shoji, Makinohara (JP); Takehisa Shimma, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 17 days.

(21) Appl. No.: 17/386,476

(22) Filed: Jul. 27, 2021

(65) Prior Publication Data

US 2022/0037867 A1 Feb. 3, 2022

(30) Foreign Application Priority Data

Jul. 29, 2020 (JP) .............................. JP2020-128588

(51) Int. Cl.
| | |
|---|---|
| *B60R 16/023* | (2006.01) |
| *H02G 3/08* | (2006.01) |
| *H02G 3/16* | (2006.01) |
| *H02G 3/14* | (2006.01) |

(52) U.S. Cl.
CPC ......... *H02G 3/081* (2013.01); *B60R 16/0239* (2013.01); *H02G 3/16* (2013.01); *H02G 3/14* (2013.01)

(58) Field of Classification Search
CPC ........................... H02G 3/081; B60R 16/0239
See application file for complete search history.

(56) References Cited

U.S. PATENT DOCUMENTS

| | | | |
|---|---|---|---|
| 11,114,829 B2 * | 9/2021 | Kurata | .................. H02G 3/081 |
| 2006/0089020 A1 | 4/2006 | Kanamaru | |
| 2009/0218129 A1 * | 9/2009 | Taniguchi | .............. H02G 3/081 |
| | | | 174/503 |
| 2014/0131061 A1 | 5/2014 | Hirasawa et al. | |

FOREIGN PATENT DOCUMENTS

| | | |
|---|---|---|
| EP | 2 056 658 A2 | 5/2009 |
| JP | 4605143 B2 | 1/2011 |
| JP | 2012-90477 A | 5/2012 |
| JP | 5088090 B2 | 12/2012 |

* cited by examiner

*Primary Examiner* — Hung V Ngo
(74) *Attorney, Agent, or Firm* — Kenealy Vaidya LLP (57) ABSTRACT

A resin structure includes: a box-shape main body having multiple regions; and multiple lids assembled to the main body. The main body has a first partition wall extending to separate between a pair of the regions. A first one of the multiple lids covers one of the pair of the regions and has a second partition wall provided at its edge portion. A second one of the multiple lids covers the other of the pair of the regions and has a third partition wall provided at its edge portion. The first partition wall and the second partition wall are located to overlap each other in a thickness direction of the first partition wall to form a multi-layer wall structure, and the first partition wall and the third partition wall are located to overlap each other in the thickness direction to form a multi-layer wall structure.

5 Claims, 8 Drawing Sheets

FIG. 8

# RESIN STRUCTURE

CROSS-REFERENCE TO RELATED APPLICATIONS

This application is based on and claims priority under 35 USC 119 from Japanese Patent Application No. 2020-128588 filed on Jul. 29, 2020, the contents of which are incorporated herein by reference.

TECHNICAL FIELD

The present invention relates to a resin structure.

BACKGROUND ART

In a recent year, a resin structure has been proposed in which a plurality of resin bodies are assembled with each other, such as an electric connection box (for example, a relay box) mounted on a vehicle. For example, in one of electrical connection boxes of the related art, a lid having a shape corresponding to an opening of a box-shaped body for accommodating electronic components and the likes is assembled to close the opening.

As for details of the above resin structure, refer to JP 5088090 B and JP 4605143 B.

By the way, depending on the specifications of the electrical connection box, the inside of a main body of the electrical connection box may be divided into a plurality of regions and a plurality of lids corresponding to each of the regions may be used to close an opening of each region. For example, from a viewpoint of improving the maintainability of the electrical connection box, each area may be designed so that a relay is mainly accommodated in one region and a fuse is mainly accommodated in other region. However, when the electrical connection box is divided into a plurality of regions and each region is closed with a lid as such, water blocking property at a boundary between adjacent regions will generally be lower than when there is no such boundary. Not limited to the electrical connection box, in a resin structure having a plurality of internal regions, the water blocking property at the boundary between adjacent regions is reduced in the same manner as described above. Therefore, when providing a plurality of regions in the resin structure as described above, it is desirable to enhance the water blocking property especially at a boundary.

SUMMARY OF INVENTION

Aspect of non-limiting embodiments of the present disclosure relates to provide a resin structure having excellent water blocking property between a plurality of regions provided in the resin structure.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a resin structure comprising: a box-shape main body having a plurality of regions dividing inside of the main body; and a plurality of lids assembled to the main body to cover corresponding each of the plurality of the regions, the main body having a first partition wall extending to separate between a pair of the regions among the plurality of the regions, the pair of the regions being adjacent each other, a first one of the plurality of the lids covering one of the pair of the regions and having a second partition wall provided at its edge portion to extend along the first partition wall, a second one of the plurality of the lids covering the other of the pair of the regions and having a third partition wall provided at its edge portion to extend along the first partition wall, the first partition wall and the second partition wall being located to overlap each other in a thickness direction of the first partition wall to form a multi-layer wall structure, and the first partition wall and the third partition wall being located to overlap each other in the thickness direction to form a multi-layer wall structure, upon the plurality of the lids being assembled to the main body.

BRIEF DESCRIPTION OF DRAWINGS

Exemplary embodiment(s) of the present invention will be described in detail based on the following figures, wherein:

FIG. 7A illustrates a separated state and FIG. 7B illustrates an engaged state.

DESCRIPTION OF EMBODIMENTS

Hereinafter, a resin structure 1 according to an embodiment of the invention illustrated in FIG. 1 will be described with reference to the drawings. The resin structure 1 is typically a relay box (electrical connection box) mounted on a vehicle and accommodating electronic components such as relays.

Figure 1:
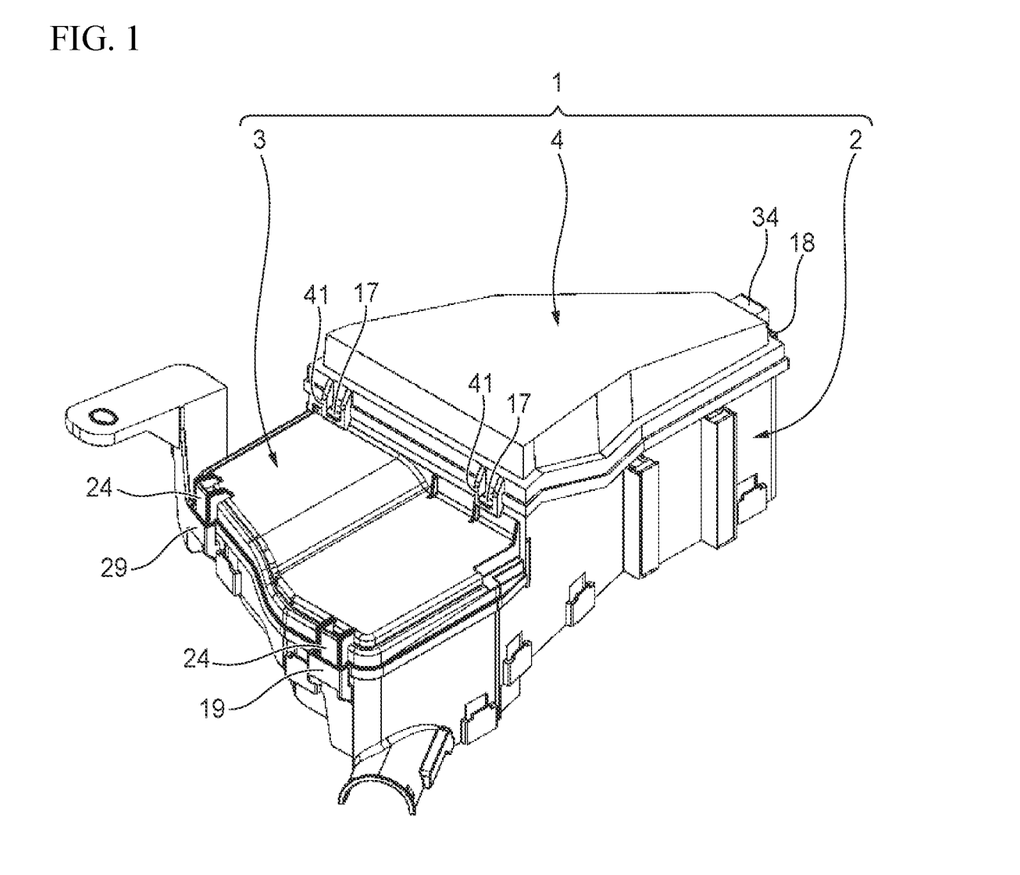
FIG. 1 is a perspective view of a resin structure according to an embodiment of the invention.
Figure 2:
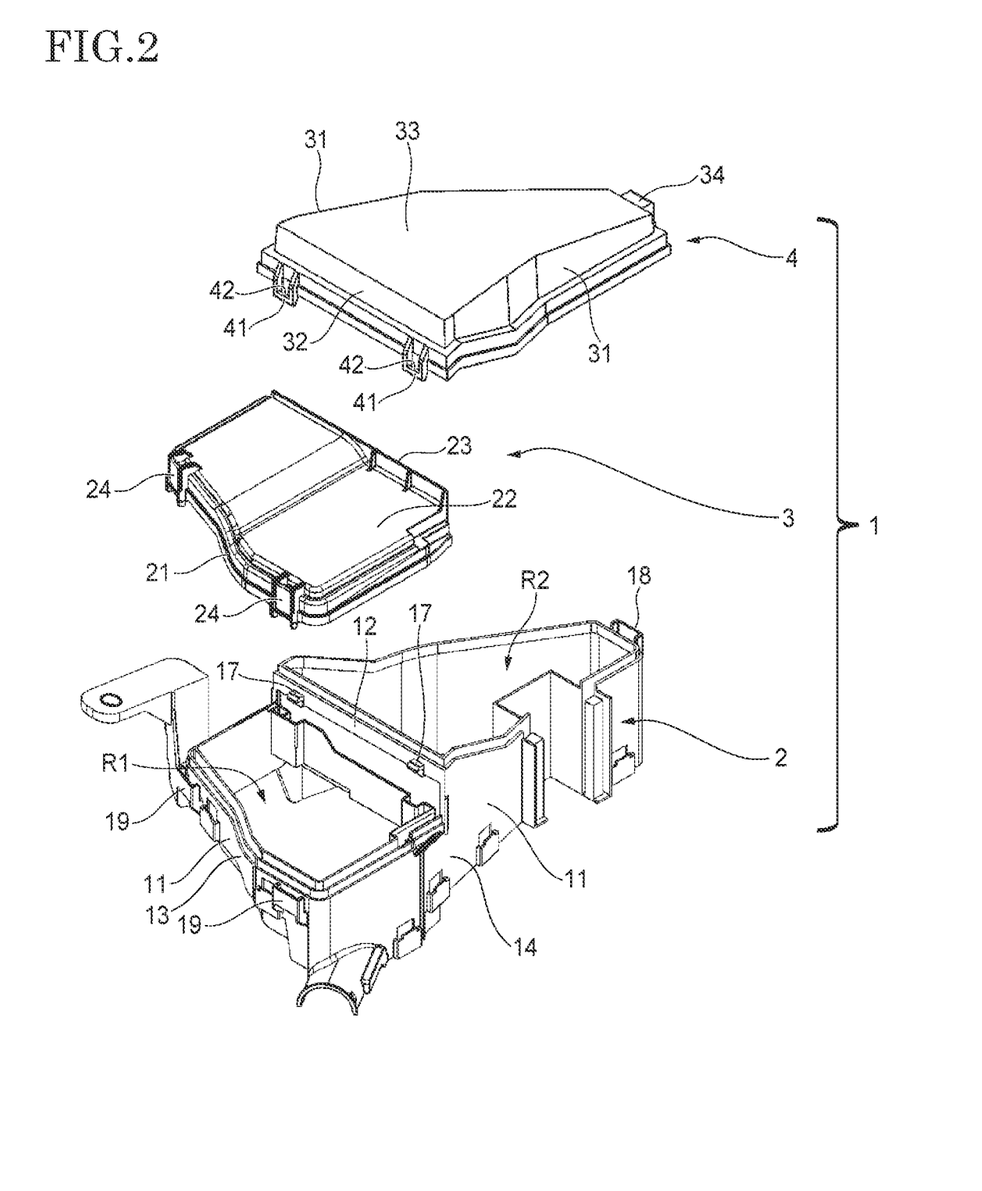
FIG. 2 is a perspective view of the resin structure illustrated in FIG. 1 in which a main body, a first lid, and a second lid are separated from each other.

As illustrated in FIGS. 1 and 2, the resin structure 1 is configured to include a main body 2 which accommodates electronic components and other parts, not illustrated) such as relays, a first lid 3 assembled to an upper end portion of the main body 2 to close an upper end opening portion of a first region R1 (see FIG. 2) inside the main body 2, and a second lid 4 assembled to an upper end portion of the main body 2 to close an upper end opening portion of a second region R2 (see FIG. 2) inside the main body 2. Each of the main body 2, the first lid 3, and the second lid 4 is a resin molded body. In the example, in order to prevent interference between parts (for example, a reservoir tank) located above the first lid 3 and the first lid 3 when mounted on a vehicle, the first lid 3 is located further on a lower side than the second lid 4 when the resin structure 1 is assembled. Hereinafter, each member forming the resin structure 1 will be described in order.

First, the main body 2 will be described. As illustrated in FIG. 2, the main body 2 has a tubular peripheral wall 11 having a predetermined shape when viewed from an up-down direction and extending in the up-down direction. The inside of the main body 2 surrounded by the peripheral wall 11 is divided into the first region R1 and the second region R2 by a flat plate-shaped first partition wall 12 which crosses the inside of the main body 2 in a predetermined direction and extends in the up-down direction. In the example, electronic components (and other components, not illustrated) such as relays are accommodated in each of the first region R1 and the second region R2.

Hereinafter, a portion of the peripheral wall 11 which surrounds the first peripheral region R1 may be referred to as a first peripheral wall 13 and a portion which surrounds the second peripheral region R2 may be referred to as a second peripheral wall 14. In this example, in order to position the first lid 3 further on the lower side than the second lid 4 when the resin structure 1 is assembled, an upper end edge of the first peripheral wall 13 is located further on the lower side than an upper end edge of the second peripheral wall 14 and an upper end edge of the first partition wall 12. Hereinafter, each member forming the resin structure 1 will be described in order.

Figure 4A:
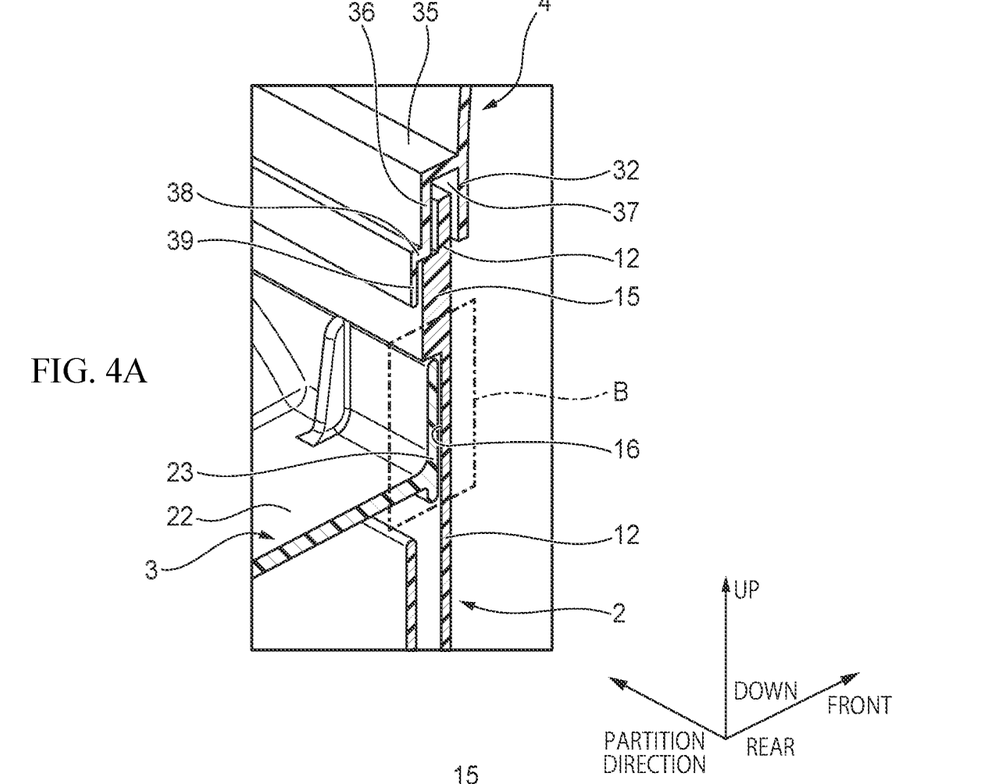
FIG. 4A is a perspective view illustrating a part of the cross section A-A of FIG. 3C
Figure 4B:
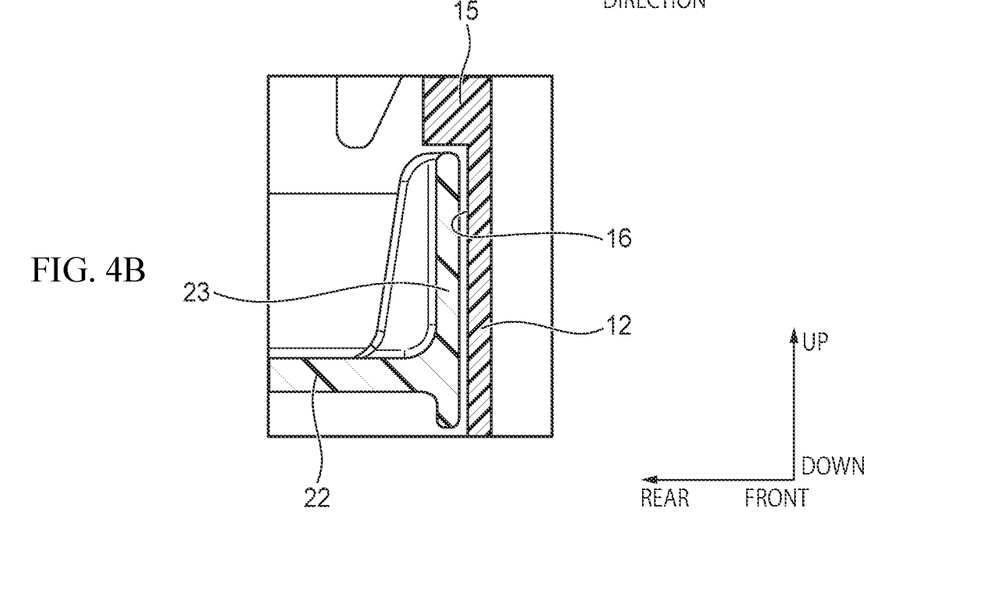
FIG. 4B is an enlarged view of a cross section illustrating in the portion B of FIG. 4A.

Hereinafter, for convenience of explanation, as illustrated in FIGS. 4A and 4B, "partition direction", "front-rear direction", "up-down direction", "front", "rear", "up" and "down" are defined. The "partition direction". "front-rear direction", and "up-down direction" are orthogonal to each other. When the resin structure 1 is mounted on the vehicle, the "up-down direction" corresponds to an up-down direction of the vehicle. The "partition direction" corresponds to the predetermined direction in which the first partition wall 12 crosses the inside of the main body 2 and the "front-rear direction" corresponds to a plate thickness direction of the first partition wall 12.

As illustrated in FIGS. 4A and 4B, at a vertical position adjacent to a lower side of an upper end edge portion of the first partition wall 12, a thick portion 15 which rises rearward and is thicker than other portions in the up-down direction of the first partition wall 12 is formed to extend in a band shape in the partition direction. As a result, on a rear side surface of a lower region of the thick portion 15 of the first partition wall 12, a recess portion 16 recessed forward is formed to extend in a band shape in the partition direction.

As illustrated in FIG. 2, a pair of locking protrusions 17 protruding rearward are provided on a rear side surface of the thick portion 15 near both end portions of the first partition wall 12 in the partition direction. When the assembly of the resin structure 1 is completed, the pair of locking protrusions 17 engage with a pair of lock arms 41 (described below) of the second lid portion 4 (see FIGS. 1 and 3C).

As illustrated in FIG. 2, an engaging portion 18 is provided at a predetermined location (one location in the example) in a circumferential direction on the second peripheral wall 14. The engaging portion 18 engages with the engaging portion 34 (described below) of the second lid 4. As illustrated in FIG. 2, engaging portions 19 are provided at a plurality of predetermined locations (two locations in the example) in the circumferential direction on the first peripheral wall 13. The plurality of engaging portions 19 will engage with a plurality of engaging portions 24 (described below) of the first lid 3.

Next, the first lid 3 will be described. As illustrated in FIG. 2, the first lid 3 is integrally provided with a peripheral wall 21 having a shape corresponding to the first peripheral wall 13 of the main body 2 and extending in the up-down direction when viewed from the up-down direction, a top wall portion 22 which closes an upper end opening portion surrounded by the peripheral wall 21, and a second partition wall 23 which protrudes upward from a front end edge extending in the partition direction and extends in the partition direction corresponding to the first partition wall 12 in the top wall portion 22. The engaging portions 24 capable of engaging with the engaging portions 19 are provided at a plurality of locations (two locations) corresponding to the plurality of engaging portions 19 of the main body 2 in the circumferential direction of the peripheral wall 21.

Next, the second lid 4 will be described. As illustrated in FIG. 2, the second lid 4 is integrally provided with a peripheral wall 31 having a shape corresponding to the second peripheral wall 14 of the main body 2 and extending in the up-down direction when viewed from the up-down direction, a third partition wall 32 extending in the partition direction and extending in the up-down direction corresponding to the first partition wall 12 to connect both end portions in the circumferential direction of the peripheral wall 31, and a top wall portion 33 which closes an upper end opening portion surrounded by the peripheral wall 31 and the third partition wall 32. An engaging portion 34 capable of engaging with the engaging portion 18 is provided at a portion (one location) corresponding to the engaging portion 18 of the main body 2 in the circumferential direction of the peripheral wall 31.

On a rear side surface of the third partition wall 32, as illustrated in FIG. 4A, a first end wall 35 which protrudes rearward from a vertical position adjacent to an upper side of a lower end edge portion and extends in the partition direction and a second end wall 36 which protrudes downward from a protruding end portion extending in the partition direction of the first end wall 35 and extends in the partition direction. As a result, a recess portion 37 which opens downward, is recessed upward, and extends in the partition direction is formed between a lower end edge portion of the third partition wall 32 and the second end wall 36.

A third end wall 38 which protrudes rearward from a lower end portion extending in the partition direction and extends in the partition direction and a fourth end wall 39 which protrude downward from a protruding end portion extending in the partition direction of the third end wall 38 and extends in the partition direction are provided on the second end wall 36.

As illustrated in FIG. 2, in vicinities of both end portions of the third and fourth end walls 38 and 39 in the partition direction, corresponding to the pair of locking protrusions 17 of the main body 2, a pair of cantilever-shaped lock arms 41 extending downward from the second end wall 36 instead of the third and fourth end walls 38 and 39 are provided. The lock arm 41 can be elastically deformed in the front-rear direction within a predetermined range. The lock arm 41 is formed with a rectangular opening 42 penetrating in the front-rear direction. A lower end edge portion of the opening 42 is locked to the locking projection 17 (described below) of the main body 2 (see also FIGS. 1 and 3C). The members forming the resin structure 1 are described above.

Figure 3A:
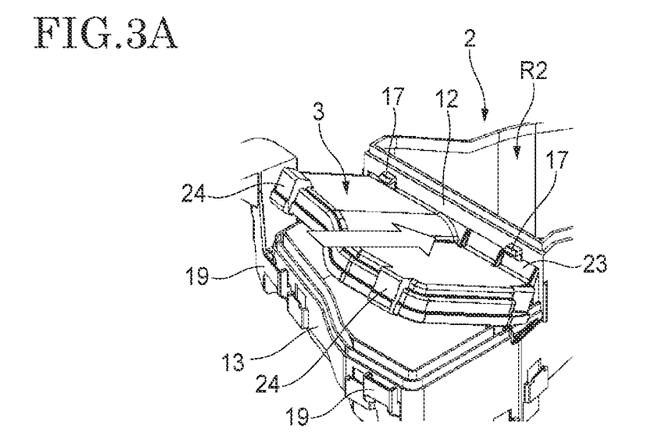
FIGS. 3A to 3C are diagrams for illustrating a procedure for assembling the first lid and the second lid to the main body.

Next, a procedure for assembling the first lid 3 and the second lid 4 to the main body 2 will be described with reference to FIGS. 3A to 3C. First, the first lid 3 is attached to the main body 2. Therefore, first, the main body 2 and the first lid 3 are provided so that the first lid 3 is located above the first region R1 of the main body 2. Then, as illustrated in FIG. 3A, in a state where the first lid 3 tilted so that a front end portion is located further on a lower side than the rear end, an upper end edge portion of the second partition wall 23 of the first lid 3 is brought closer to (see the arrow in FIG. 3A) the recess portion 16 of the main body 2 and the upper end edge portion of the second partition wall 23 is locked to an upper corner portion (a lower root portion of the thick portion 15) of the recess portion 16 over the entire partition direction (see FIG. 3A).

Figure 3B:
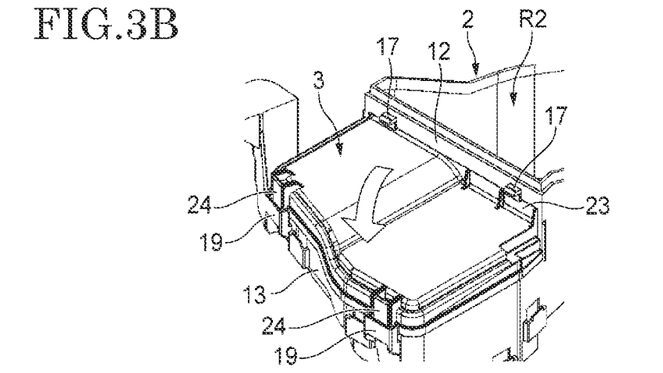

Then, as illustrated in FIG. 3B, while pivoting the first lid 3 in a direction (direction to return the first lid 3 to the horizontal) in which a rear end portion of the first lid 3 moves downward, centering on the upper end edge portion (that is, the front end portion of the first lid 3) of the second partition wall 23 locked in an upper corner portion of the recess portion 16 (see the arrow in FIG. 3B), the first lid 3 is attached to the main body 2 so that the peripheral wall 21 of the first lid 3 overlaps the outside of the first peripheral wall 13 of the main body 2 (see FIGS. 3B, 4A, and 4B).

In a state where the assembly of the first lid 3 to the main body 2 is completed, the second partition wall 23 is accommodated in the recess portion 16, as illustrated in FIGS. 4A and 4B. Therefore, an upper end surface of the second partition wall 23 and the inner wall surface (the lower end surface of the thick portion 15) of an upper edge of the recess portion 16 are engaged with each other, such that the front end portion of the first lid 3 and the main body 2 are prevented from being separated in the up-down direction. In other words, the front end portion of the first lid 3 and the main body 2 are prevented from being separated in the up-down direction without separately providing a locking structure for fixing. The engagement between the engaging portion 19 of the main body 2 and the engaging portion 24 of the first lid 3 (see FIG. 1) prevents a rear end portion of the first lid 3 and the main body 2 from being separated in the up-down direction.

In a state where the assembly of the first lid 3 to the main body 2 is completed, as illustrated in FIGS. 4A and 4B, the first partition wall 12 of the main body 2 and the second partition swill 23 of the first lid 3 are overlapped (by being laminated) in the front-rear direction, such that a multi-layer wall structure (specifically, a double wall structure; a so-called labyrinth-like structure) is constructed. As a result, a creepage distance becomes longer than when the first partition wall 12 and the second partition wall 23 are simply attached, and thus water can be prevented from entering the inside of the main body 2 from a portion between the adjacent areas R1 and R2.

Figure 3C:
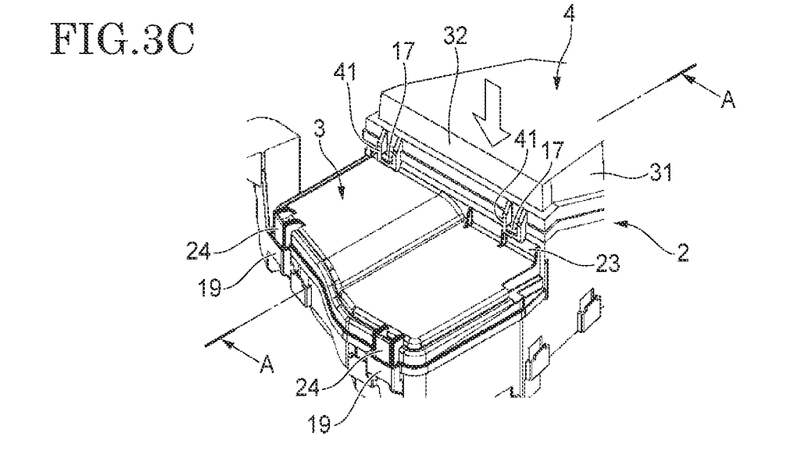

Next, as illustrated in FIG. 3C, the second lid 4 is assembled to the main body 2 in which the assembly of the first lid 3 is completed. Therefore, first, the main body 2 and the second lid 4 are provided so that the second lid 4 is located above the second region R2 of the main body 2. Then, in a state where the second lid 4 is kept horizontal, the main body 2 and the second lid 4 are brought closer to each other in the up-down direction (see the arrow in FIG. 3C), the second lid 4 is assembled to the main body 2 so that the upper edge portion of the first partition wall 12 of the main body 2 is fitted into the recess portion 37 (see FIG. 4A) of the second lid 4 and so that the peripheral wall 31 of the second lid 4 overlaps the outside of the second peripheral wall 14 of the main body 2 (see FIGS. 3C, 4A, and 4B). As a result, the assembly of the first lid 3 and the second lid 4 to the main body 2 is completed and the resin structure 1 illustrated in FIG. 1 is obtained.

In a state (the state where the assembly of the resin structure 1 is completed) where the assembly of the second lid 4 to the main body 2 is completed, the lower end edge portions of the openings 42 of the pair of lock arms 41 of the second lid 4 and the pair of locking protrusions 17 of the main body 2 are engaged with each other and the engaging portion 18 of the main body 2 and the engaging portion 34 of the second lid 4 are engaged with each other (see FIG. 1), such that the main body 2 and the second lid 4 are prevented from being separated in the up-down direction.

In a state (the state where the assembly of the resin structure 1 is completed) where the assembly of the second lid 4 to the main body 2 is completed, as illustrated in FIG. 4A, the first partition wall 12 of the main body 2 which enters the recess portion 37 and the third partition wall 32 of the second lid 4 overlap (by being stacked on) each other in the front-rear direction, such that a multi-layered wall structure (specifically, a double-walled structure; a so-called labyrinth-like structure) is constructed. As a result, the creepage distance becomes longer than when the first partition wall 12 and the third partition wall 32 are simply attached. As a result, water can be prevented from entering the inside of the main body 2 from a portion between the adjacent areas R1 and R2.

From the above, according to the resin structure 1 according to the embodiment, when the main body 2 and the first lid 3 which form the resin structure 1 are assembled, the first partition wall 12 of the main body 2 and the second partition wall 23 of the first lid 3 are overlapped with each other, such that a multi-layer wall structure (a so-called labyrinth-like structure) is formed. Similarly, when the main body 2 and the second lid 4 are assembled, the first partition wall 12 of the main body and the third partition wall 32 of the second lid 4 are overlapped, such that a multi-layer wall structure is formed. Due to such structures, the creepage distance is longer than when the first partition wall 12, the second partition wall 23, and the third partition wall 32 are simply attached. As a result, it is possible to strongly prevent the invasion of water into the resin structure 1 from boundaries between the adjacent regions R1 and R2. Therefore, the resin structure 1 according to the embodiment is excellent in water blocking property between the plurality of regions R1 and R2 provided in the resin structure 1 without using a water blocking component such as packing.

According to the resin structure 1 according to the embodiment, the recess portion 16 having a recessed shape and provided in the first partition wall 12 of the main body 2 regulates the movement of the second partition wall 23 of the first lid 3 in a direction (upward) where the second partition wall 23 is separated from the main body 2. Therefore, for example, when assembling the first lid 3 to the main body 2, the first lid 3 can be assembled to the main body 2 while pivoting on a contact point between the recess portion 16 of the main body 2 and the first lid 3. Since the movement of the first lid 3 is restricted by the recess portion 16, it is possible to prevent the first lid 3 from coming off from the main body 2 without separately providing a locking structure for fixing or the like. Therefore, the internal space of the main body 2 can be expanded to improve the storage performance of the resin structure 1 by the amount that such a locking structure can be omitted. Since it is not necessary to provide such a locking structure on the peripheral wall of the main body 2, it can contribute to the miniaturization of the resin structure 1.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

In the embodiment described above, a lower corner portion (upper edge portion of the recess portion 16) of the thick portion 15 of the first partition wall 12 of the main body 2 is not provided with a rib over the entire partition direction (see FIGS. 4A and 4B). On the other hand, as in a first modification example illustrated in FIGS. 5A and 5B, a rib 15a protruding downward may be provided at a predetermined portion in the partition direction at the lower corner portion (upper edge portion of the recess portion 16) of the thick portion 15 of the first partition wall 12.

Accordingly, the engagement of a rear end face of the upper edge portion of the second partition wall 23 with a front end face of the rib 15a may further restrict the movement of the second partition wall 23 in a direction (rearward direction) where the second partition wall 23 is away from the first partition wall 12. As a result, the first lid 3 is more strongly, prevented from being unintentionally detached from the main body 2 after the main body 2 and the first lid 3 are once assembled. In the modification examples illustrated in FIGS. 5A and 5B, the ribs 15a are respectively provided only at positions where the pair of locking protrusions 17 are provided in the partition direction. However, the rib 15a, may be provided at another position in the partition direction, or the rib 15a may be provided over the entire partition direction.

Figure 5A:
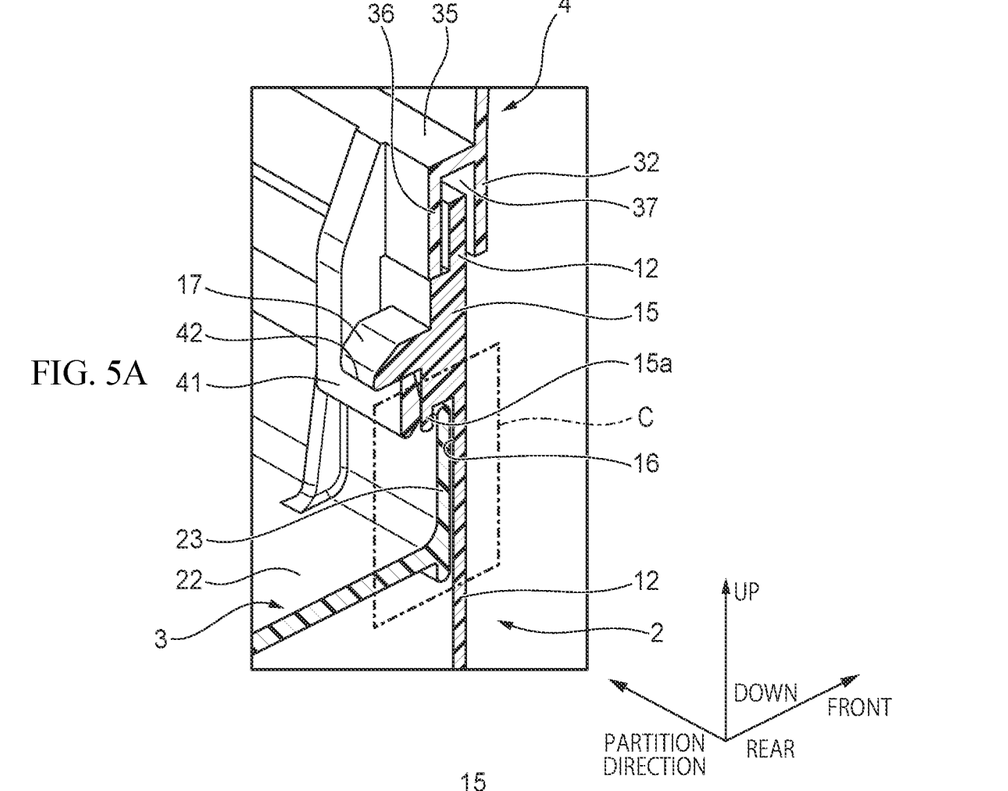
FIG. 5A is a perspective view illustrating a cross section orthogonal to a partition direction at an engagement portion between a locking protrusion of a main body and a lock arm of a second lid according to a first modification example and FIG. 5B is an enlarged view of a cross section illustrated in the portion C of FIG. 5A.
Figure 5B:
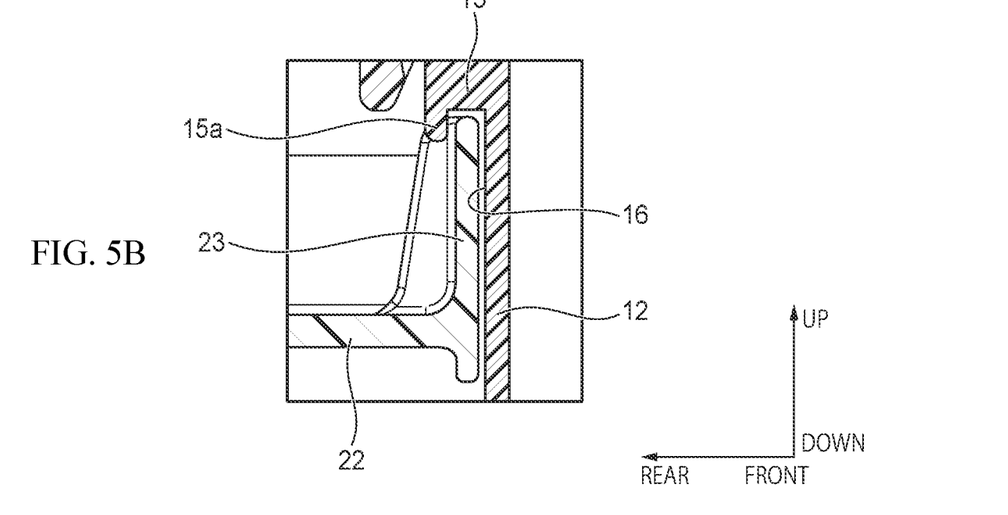
Figure 6A:
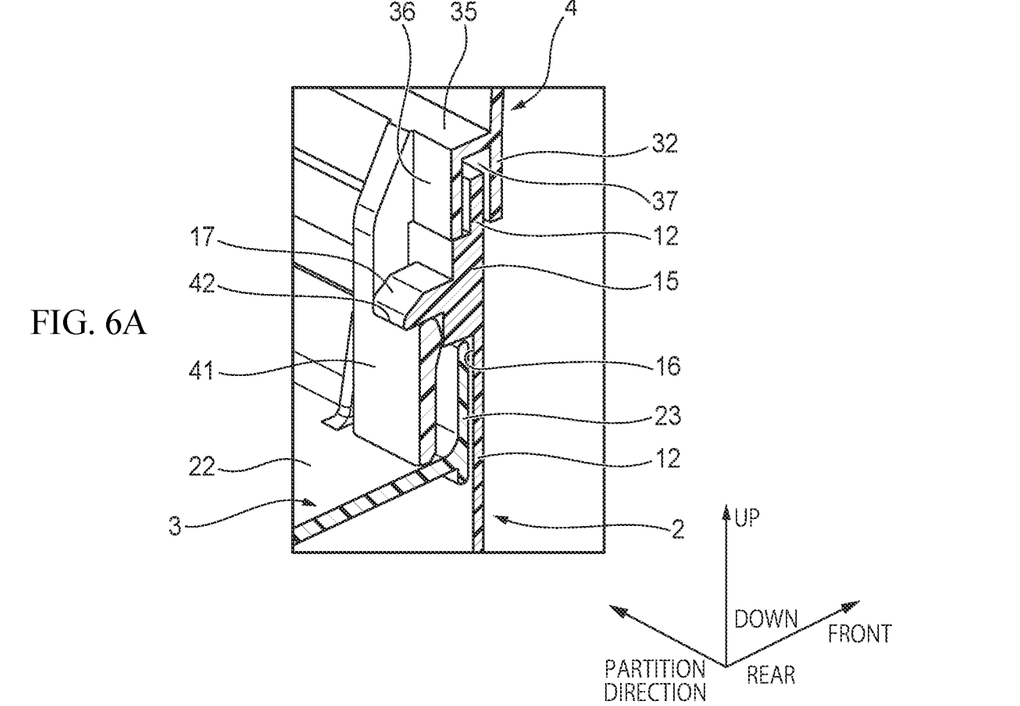
FIG. 6A is a diagram corresponding to FIG. 5A according to a second modification example and FIG. 6B is a diagram corresponding to FIG. 5A according to a third modification example.
Figure 6B:
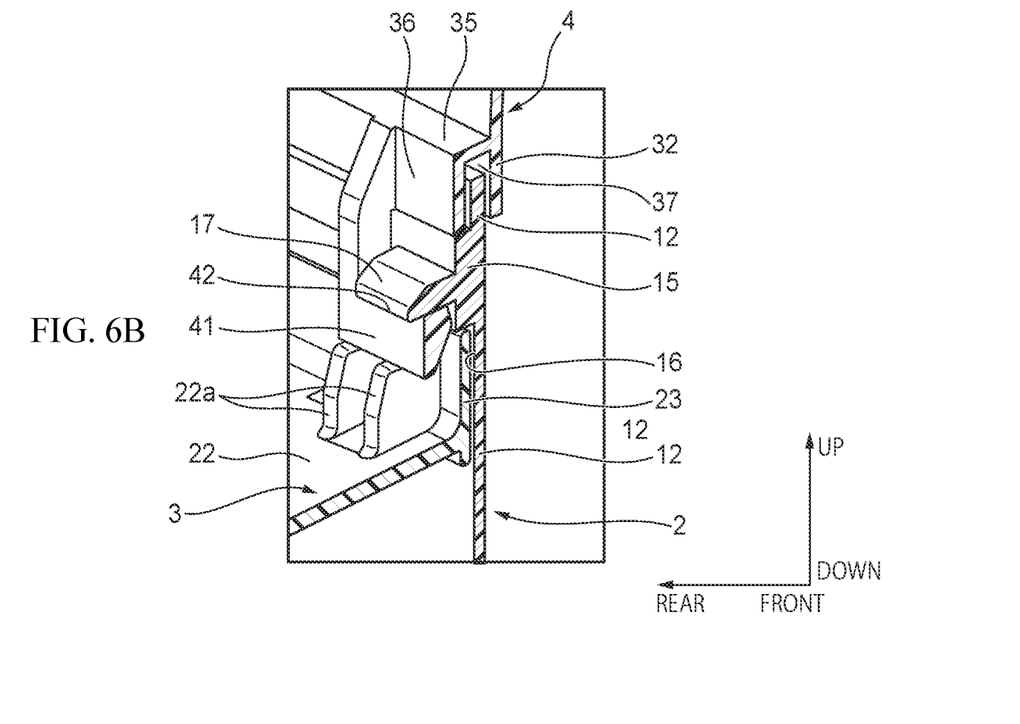

In the embodiment described above, in the state (the state where the assembly of the resin structure 1 is completed) where the first and second lids 3 and 4 are assembled to the main body 2 the lower end portion of the lock arm 41 of the second lid 4 does not conic into contact with the top wall portion 22 of the first lid 3 (see FIGS. 1 and 5A). On the other hand, as in a second modification example illustrated in FIG. 6A, by extending the lower end portion of the lock arm 41 downward, the lower end portion of the lock arm. 41 of the second lid 4 may be configured to come into contact with the top wall portion 22 of the first lid 3 when the assembly of the resin structure 1 is completed. Alternatively, without extending the lower end portion of the lock arm 41 downward, as in a third modification example illustrated in FIG. 6B, the lower end portion of the lock arm 41 may be configured to come into contact with a protrusion 22a protruding upward from the upper surface of the top wall portion 22 of the first lid 3. Accordingly, it can be regulated that the second partition wall 23 of the first lid 3 moves in the direction (upward direction) where the second partition wall 23 is separated from the main body 2, and thus the first lid 3 is more strongly prevented from being unintentionally detached from the main body 2 when the assembly of the resin structure 1 is completed.

Figure 7A:
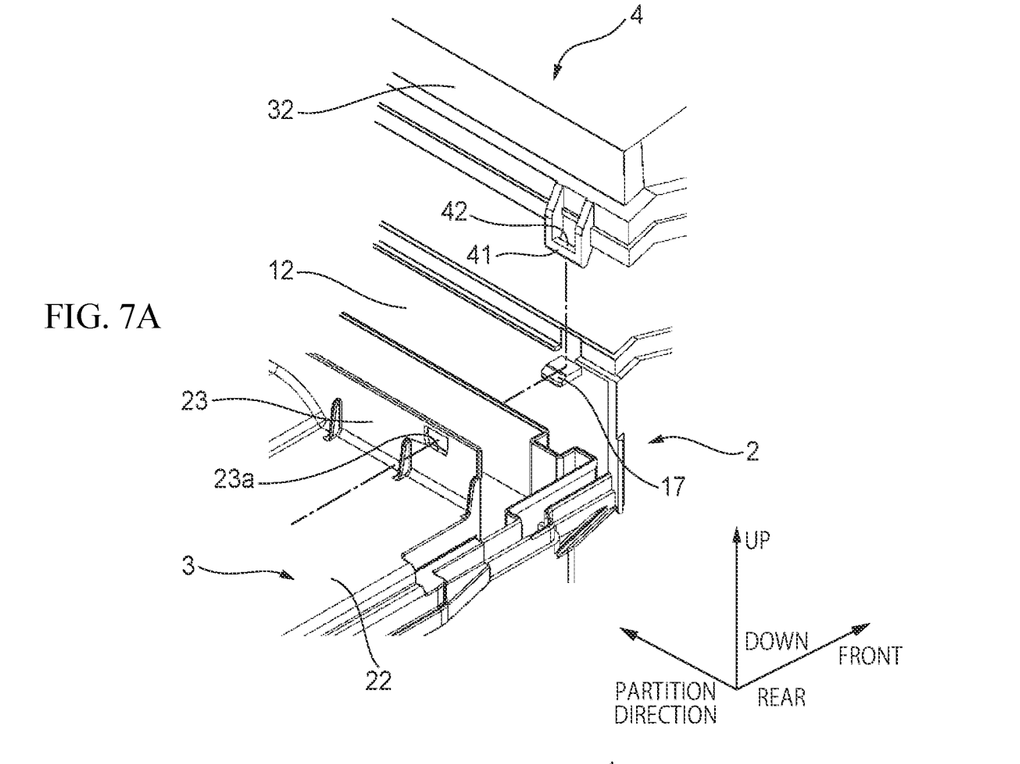
FIGS. 7A and 7B are perspective views illustrating a periphery of an engagement portion between a locking protrusion of a main body, a locking hole of a first lid, and a lock arm of a second lid according to a fourth modification example, where
Figure 7B:
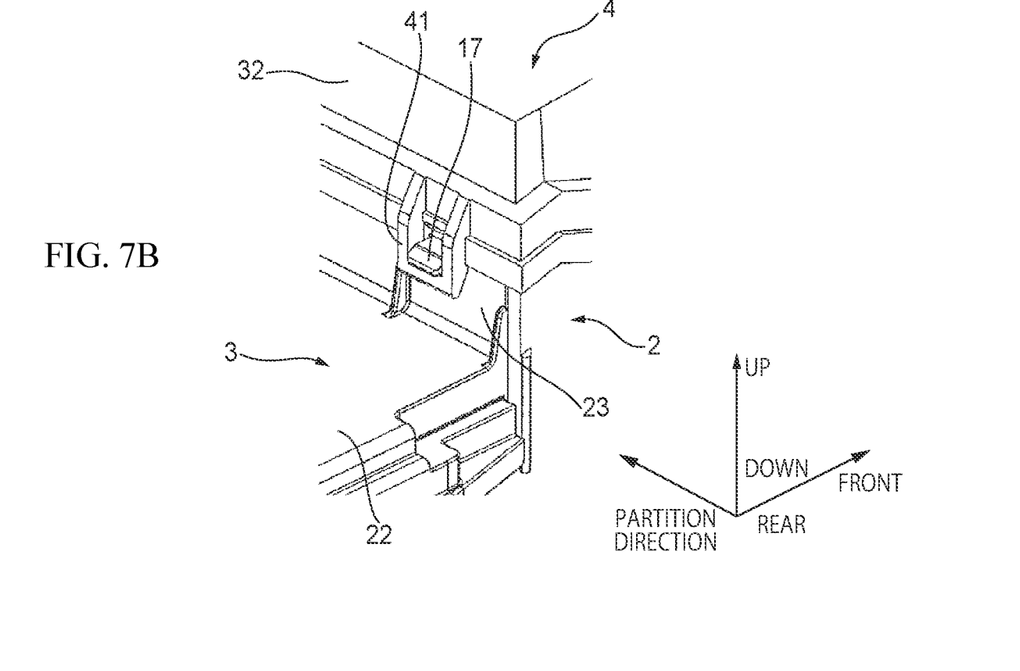
Figure 8:
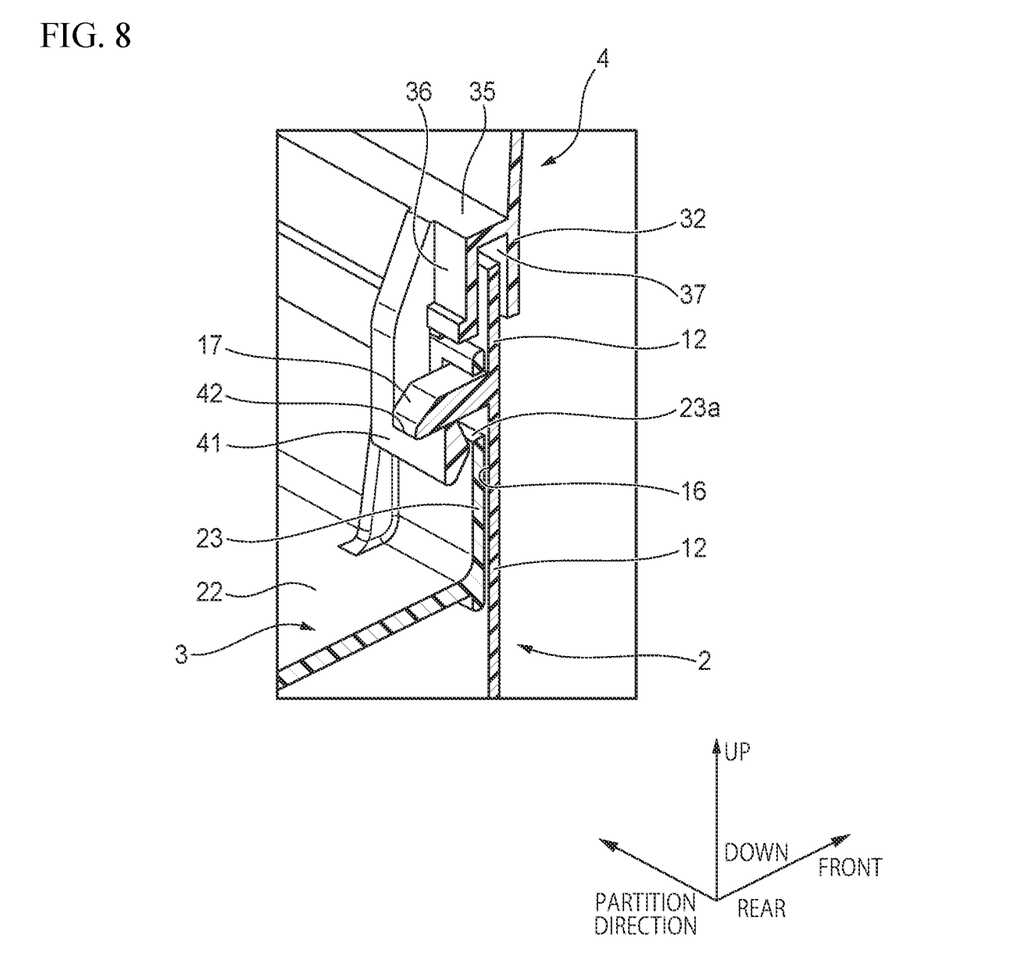
FIG. 8 is a diagram corresponding to FIG. 5A in the modification example illustrated in FIG. 7.

In the embodiment described above, in the state (the state where the assembly of the resin structure 1 is completed) where the first and second lids 3 and 4 are assembled to the main body 2, the pair of lock arms 41 of the second lid 4 are engaged with the pair of locking protrusions 17 of the main body 2 while not being engaged with any part of the first lid 3 (FIGS. 1 and 3C). On the other hand, as in a fourth modification example illustrated in FIG. 7A, the second partition wall 23 of the first lid 3 is provided with a pair of locking holes 23a penetrating in the front-rear direction in vicinities of both end portions in the partition direction corresponding to the pair of locking protrusions 17 and the first lid 3 is assembled to the main body 2 so that the pair of locking holes 23a are inserted into the pair of locking protrusions 17, and then the second lid 4 may be assembled to the main body 2 so that the pair of lock arm 41s are engaged with the pair of locking protrusions 17 into which the pair of locking holes 23a are inserted (see FIGS. 7B and 8).

Accordingly, in a state where the second partition wall 23 and the third partition wall 32 are overlapped (stacked) in the front-rear direction, the locking protrusion 17 is engaged with the locking hole 23a of the second partition wall 23 and the lock arm 41 of the third partition wall 32. Accordingly, compared to the case where the second partition wall 23 and the third partition wall 32 are fixed to the first partition wall 12 separately, the locking structure can be omitted, and thus the internal space of the main body 2 can be expanded and it is possible to improve the storage performance of the resin structure 1. Since it is not necessary to provide such a locking structure on the peripheral wall of the main body 2, it can contribute to the miniaturization of the resin structure 1.

According to the above exemplary embodiments, the resin structure (1) comprises: a box-shape main body (2) having a plurality of regions (R1, R2) dividing inside of the main body (2); and a plurality of lids (3, 4) assembled, to the main body (2) to cover corresponding each of the plurality of the regions (R1, R2), the main body (2) having a first partition wall (12) extending to separate between a pair of the regions (R1, R2) among the plurality of the regions (R1, R2), the pair of the regions (R1, R2) being adjacent each other, a first one (3) of the plurality of the lids (3, 4) covering one of the pair of the regions (R1, R2) and having a second partition wall (23) provided at its edge portion to extend along the first partition wall (12), a second one (4) of the plurality of the lids (3, 4) covering the other of the pair of the regions (R1, R2) and having a third partition wall (32) provided at its edge portion to extend along the first partition wall (12), the first partition wall (12) and the second partition wall (23) being located to overlap each other in a thickness direction of the first partition wall (12) to form a multi-layer wall structure, and the first partition wall (12) and the third partition wall (32) being located to overlap each other in the thickness direction to form a multi-layer wall structure, upon the plurality of the lids (3, 4) being assembled to the main body (2).

According to the resin structure having the configuration described above, when the main body and a plurality of lids which form the resin structure are assembled, the first partition wall of the main body and the second partition wall of one of the plurality of lids are overlapped with each other, such that a multi-layer wall structure (a so-called labyrinth-like structure) is formed. Similarly, the first partition wall of the main body and the third partition wall of the other of the plurality of lids are overlapped, such that a multi-layer wall structure is formed. Due to such multi-layer wall structures, the creepage distance is longer than when the first partition wall, the second partition wall, and the third partition wall are attached. As a result, it is possible to prevent the invasion of water into the resin structure from boundaries between the adjacent regions. Therefore, the resin structure having such configuration is excellent in water blocking property between the plurality of regions provided in the resin structure without using a water blocking component such as packing.

In the resin structure (1), the first partition wall (12) may have: a recessed first regulating portion (16) receiving at least a part of the second partition wall (23) to regulate a movement of the second partition wall (23) in a direction where the second partition wall (23) is separated from the main body (2); and a locked portion (17) engaging with a locking portion (41) of the third partition wall (32).

According to the resin structure having the configuration described above, the regulating portion having a recessed shape and provided in the first partition wall of the main body regulates the movement of the second partition wall of one lid in a direction where the second partition wall is separated from the main body. Therefore, for example, when assembling one lid to the main body, the lid can be assembled to the main body while pivoting on a contact point between the regulating portion of the main body and the lid. Since the movement of the lid is restricted by the regulating portion, it is possible to prevent the lid from coming off from the main body without separately providing a locking structure for fixing or the like. Therefore, the internal space of the main body can be expanded to improve the storage performance of the resin structure by the amount that such a locking structure can be omitted. Since it is not necessary to provide such a locking structure on the peripheral wall of the main body, it can contribute to the miniaturization of the resin structure. By engaging the locking portion provided on the third partition wall of the other lid and the locked portion provided on the first partition wall, the state where the other lid is assembled to the main body is maintained.

In the resin structure (1), the first regulating portion (16) of the first partition wall (12) may have a protruding holding point (15a) to further regulate a movement of the second partition wall (23) in a direction where the second partition wall (23) is away from the first partition wall (12) in the thickness direction.

According to the resin structure having the configuration described above, in addition to the above-described regulation of the movement of the second partition wall, the regulating portion of the first partition wall of the main body regulates the movement of the second partition swill in a direction where the second partition wall is away from the first partition wall. As a result, after the main body and one lid are once assembled, and the lid is more strongly prevented from being unintentionally detached from the main body.

In the resin structure (1), the locking portion (41) of the third partition wall (32) may make a contact with the first one (3) of the plurality of the lids (3, 4) to further regulate a movement of the second partition wall (23) in a direction where the second partition wall (23) is separated from the main body (2).

According to the resin structure having the configuration described above, the locking portion (for example, lock arm) of the other lid comes into contact with one lid, such that the second partition wall of one lid is restricted from moving in a direction where the second partition wall is separated from the main body. As a result, after the main body and both lids are once assembled, one lid is more strongly prevented from being unintentionally detached from the main body. For example, the contact may be achieved by a protruding portion which protrudes from the locking portion toward one lid, or the contact may be achieved by a protruding portion protruding from one lid toward the locking portion. Another structure for contact may be used.

In the resin structure (1), the first partition wall (12) may have a second regulating portion (17) engaging with both of the second partition wall (23) and the third partition wall (32) to regulate movements of the second partition wall (23) and the third partition wall (32) in a direction where the second partition wall (23) and the third partition wall (32) are separated from the main body (2), and the second regulating portion (17) may be engaged with the second partition wall (23) and the third partition wall (32) in a state where the second partition wall (23) and the third partition wall (32) are overlapped in the thickness direction.

According to the resin structure having the configuration described above, the regulating portion (for example, the protruding claw portion) of the first partition wall of the main body engages with both (for example, the locking holes provided on both sides) the second partition wall and the third partition wall which overlap each other. As a result, compared to the case where the second partition wall and the third partition wall are separately fixed to the first partition wall, the internal space of the main body can he expanded and the storage performance of the resin structure can be improved by the amount that the lock structure can be omitted. Since it is not necessary to provide such a locking structure on the peripheral wall of the main body, it can contribute to the miniaturization of the resin structure.

As described above, according to the invention, it is possible to provide a resin structure having excellent water blocking property between a plurality of regions provided in the resin structure.

What is claimed is:

1. A resin structure comprising:
a box-shape main body having a plurality of regions dividing inside of the main body; and
a plurality of lids assembled to the main body to cover corresponding each of the plurality of the regions,
the main body having a first partition wall extending to separate between a pair of the regions among the plurality of the regions, the pair of the regions being adjacent each other,
a first one of the plurality of the lids covering one of the pair of the regions and having a second partition wall provided at its edge portion to extend along the first partition wall,
a second one of the plurality of the lids covering the other of the pair of the regions and having a third partition wall provided at its edge portion to extend along the first partition wall,
the first partition wall and the second partition wall being located to overlap each other in a thickness direction of the first partition wall to form a multi-layer wall structure, and the first partition wall and the third partition wall being located to overlap each other in the thickness direction to form a multi-layer wall structure, upon the plurality of the lids being assembled to the main body, and the first partition wall has a recessed first regulating portion receiving at least a part of the second partition wall to regulate a movement of the second partition wall in a direction where the second partition wall is separated from the main body.

2. The resin structure according to claim 1, wherein the third partition wall has a locking portion, and the first partition wall has a locked portion engaging with the locking portion of the third partition wall.

3. The resin structure according to claim 2, wherein the first regulating portion of the first partition wall has a protruding holding point to further regulate a movement of the second partition wall in a direction where the second partition wall is away from the first partition wall in the thickness direction.

4. The resin structure according to claim 2, wherein the locking portion of the third partition wall make a contact with the first one of the plurality of the lids to further regulate a movement of the second partition wall in a direction where the second partition wall is separated from the main body.

5. A The resin structure comprising:

a box-shape main body having a plurality of regions dividing inside of the main body; and a plurality of lids assembled to the main body to cover corresponding each of the plurality of the regions, the main body having a first partition wall extending to separate between a pair of the regions among the plurality of the regions, the pair of the regions being adjacent each other, a first one of the plurality of the lids covering one of the pair of the regions and having a second partition wall provided at its edge portion to extend along the first partition wall, a second one of the plurality of the lids covering the other of the pair of the regions and having a third partition wall provided at its edge portion to extend along the first partition wall, the first partition wall and the second partition wall being located to overlap each other in a thickness direction of the first partition wall to form a multi-layer wall structure, and the first partition wall and the third partition wall being located to overlap each other in the thickness direction to form a multi-layer wall structure, upon the plurality of the lids being assembled to the main body, wherein the first partition wall has a second regulating portion engaging with both of the second partition wall and the third partition wall to regulate movements of the second partition wall and the third partition wall in a direction where the second partition wall and the third partition wall are separated from the main body, and the second regulating portion is engaged with the second partition wall and the third partition wall in a state where the second partition wall and the third partition wall are overlapped in the thickness direction.

\* \* \* \* \*